United States Patent [19]

Abbagnaro et al.

[11] Patent Number: 4,787,548

[45] Date of Patent: Nov. 29, 1988

[54] NOZZLE STRUCTURE FOR SOLDERING AND DESOLDERING

[75] Inventors: Louis A. Abbagnaro, Silver Spring, Md.; Bobby L. Mason, Alexandria, Va.

[73] Assignee: Pace Incorporated, Laurel, Md.

[21] Appl. No.: 78,170

[22] Filed: Jul. 27, 1987

[51] Int. Cl.[4] .......................... B23K 3/04; B23K 37/04
[52] U.S. Cl. ....................................... 228/6.2; 228/20;
228/44.7; 228/264; 219/373; 222/566
[58] Field of Search ................ 228/6.2, 20, 44.7, 264,
228/180.2, 191; 219/373; 222/630, 566

[56] References Cited

U.S. PATENT DOCUMENTS

| | | | |
|---|---|---|---|
| 3,676,911 | 7/1972 | Austin | 228/44.7 |
| 3,912,153 | 10/1975 | Hartleroad et al. | 228/6.2 |
| 4,564,135 | 1/1986 | Barresi et al. | 228/6.2 |
| 4,610,388 | 9/1986 | Koltuniak et al. | 219/373 |
| 4,634,043 | 1/1987 | Avedissian | 228/180.2 |
| 4,659,004 | 4/1987 | Fridman | 228/6.2 |

OTHER PUBLICATIONS

IBM Technical Disclosure Bulletin, "Solder Reflow Tool", C. Trollman, vol. 11, No. 10, Mar. 1969.

*Primary Examiner*—Nicholas P. Godici
*Assistant Examiner*—Samuel M. Heinrich
*Attorney, Agent, or Firm*—Gerald J. Ferguson, Jr.

[57] ABSTRACT

A nozzle device is adjustably positionable over a component which is disposed on a substrate, for registering relatively precisely against the component relative to the substrate for delivering a flow of uniformly heated air. The heated air is directed to the sides of the component to melt solder associated with terminals thereon. A series of changeable nozzles can be used for various component and terminal configurations and can be moved into or out of registry with the component. A vacuum apparatus can be provided for contacting the component to remove the component from the substrate. Notched end portions of inwardly projecting walls on the nozzle provide accurate registration with upper edges of the component, and permit accurate spacing of a skirt portion of the device relatively evenly from the substrate and relatively evenly from the sidewalls of the component.

23 Claims, 4 Drawing Sheets

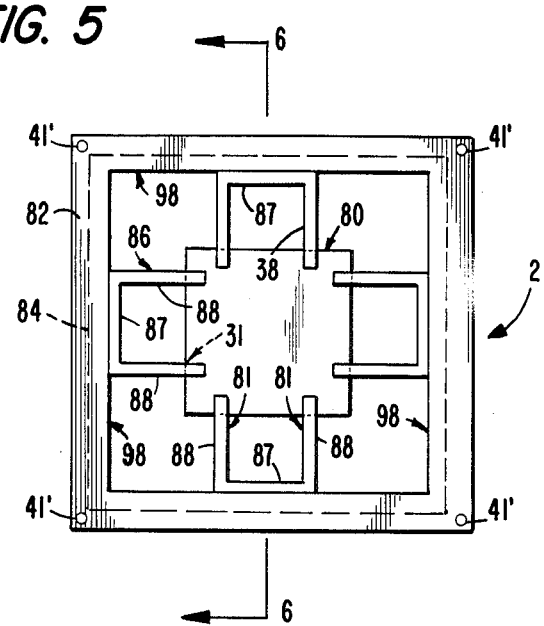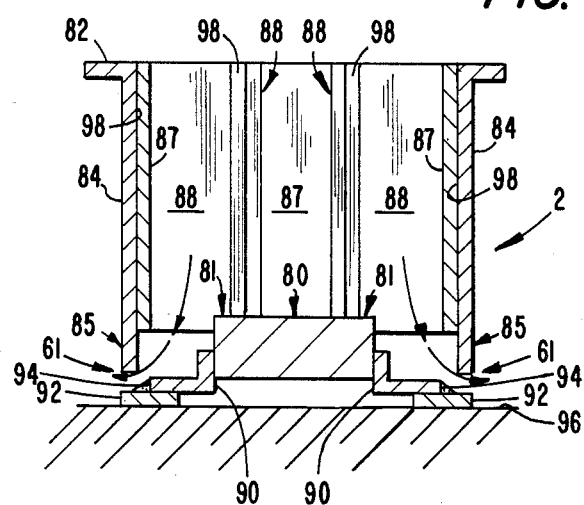

NOZZLE STRUCTURE FOR SOLDERING AND DESOLDERING

This application is related to application Ser. No. 595,606 filed Apr. 2, 1984, now U.S. Pat. No. 4,620,659, which is a continuation-in-part of application Ser. No. 583,218 filed Feb. 24, 1984, now U.S. Pat. No. 4,605,152; and is also related to application Ser. No. 492,989 filed May 9, 1984; Ser. No. 742,702 filed June 7, 1985, now U.S. Pat. No. 4,687,907; Ser. No. 649,065 filed Sept. 10, 1984; Ser. No. 790,448 filed Oct. 23, 1985, now abandoned; all of the aforementioned applications being assigned to the assignee of the subject application and incorporated by reference herein.

BACKGROUND OF THE INVENTION

1. Field of the Invention

The invention relates generally to nozzle devices and more particularly to a device for registering accurately with, and directing heated air about, modular electronic components, and to attaching or removing same from a substrate such as a printed circuit board.

2. Background of the Invention

Devices suitable for use in removing or installing modular electronic components from a substrate such as a printed circuit board include those which direct heated air at the terminals of the component from a source of heated air above the component to simultaneously melt the solder on each of the terminals. Examples of such devices are disclosed in U.S. Pat. Nos. 4,295,596 and 4,366,925. The devices in each of those two patents operate by directing hot air onto the terminals of a component, followed by removal of the component either mechanically or by the application of suction.

A disadvantage associated with the prior devices is that heated air is not delivered uniformly to the terminals, and this results in the generation of hot spots in the region of the terminals and non-uniform melting of the solder. In light of this, removal of the components is often hindered due to the fact that the solder at one or more of the terminals is not melted when the solder at the remaining terminals is melted, and removal of the component under these circumstances is often accompanied by damage to the component, to the leads and/or to the printed circuit board.

Other prior art hot air delivering systems employ double wall structures to direct the flow of heated air to the component terminals, the air being directed between the walls (which constitutes one of the walls of the double wall structure) of a nozzle and the walls (which constitutes the other wall of the double wall structure) of a vacuum pick-up device which engages the sides of the component. However, the vacuum pick-up device is also heated by the hot air and thus transfers an undesirable amount of heat to the component due to the large contact area of the pick-up device with the component.

It is therefore an object of the present invention to provide an improved device for delivering heated fluid to the sides of the component to uniformly melt solder at terminals disposed at the periphery of the component to facilitate clean installation or removal of the component from a substrate.

It is another object of this invention to provide an improved device of the foregoing type wherein heat transferred to a component is minimized due to the configuration of the heated fluid delivery structure.

It is another object of the present invention to provide an improved device of the above type incorporating a nozzle member having a lower depending skirt portion for obtaining an even distribution of heated air about the terminals in order to avoid the generation of hot spots and to ensure simultaneous melting of solder at all of the terminals to enable easy removal of the component from or installation of the component upon a printed circuit board.

It is a further object of the present invention to provide a constricted passageway to the heated fluid in the vicinity of the terminals to facilitate rapid and effective heat transfer from the heater fluid to the solder to be melted at the terminals.

It is another object of the present invention to provide an improved nozzle suitable for use in conjunction with a device which is used in the installing and removal of electronic components from circuits printed on a substrate.

It is another object of the present invention to provide a device of the subject type which employs a nozzle having a relatively precise component registration means, for locating the nozzle relative to the sides of the component as well as for locating the nozzle relative to the substrate, for precisely directing the flow of hot air from a source of hot air about the component to the solder which is associated with each component terminal or printed conductor on the substrate.

It is a further object of the present invention to provide a nozzle having inwardly-projecting walls having notched regions and a lower depending skirt, registration of top edges of the component with the notched regions in the projecting walls permitting accurate disposition of the skirt uniformly about the component and also permitting accurate positioning of the lowermost edge of the skirt above the substrate.

It is a further object of the present invention to provide, in a device of the above-described type, a generally rectangular nozzle which has a plurality of channel-shaped members, the channel-shaped members having generally parallel sidewalls which are disposed to project inwardly toward a central opening defined by the surrounding nozzle wall, lowermost edges of the inwardly-projecting sidewalls of the channel-shaped members having respective notches formed therein at a lowermost portion thereof, the notches being adapted to positively register with and snugly engage the top portion and sidewalls of a component.

It is a further object of the present invention wherein the inwardly projecting walls or channel-shaped members are thin and made of a material having low thermal conductivity whereby the amount of heat transferred to the component from the inwardly projecting walls or channel-shaped members is minimized.

It is a further object of the present invention to utilize the above-mentioned notches of the channel shaped members or the inwardly projecting walls to affect alignment of a component to be desoldered with the nozzle in that the component may have its position adjusted until the component engages all of the notches at which time alignment of the component with the nozzle is effected.

It is a further object of the invention to utilize the alignment effected above whereby after the component is desoldered, a new replacement component may be positioned in the notches and will be perfectly aligned with pads or the like on the board for connection thereto since the nozzle may be returned to exactly the same position it was in at the time the defective component was removed.

These and other objects of the present invention will be understood by those acquainted with the design and construction of such devices upon reading of the following detailed description in conjunction with the accompanying drawings.

BRIEF DESCRIPTION OF THE DRAWINGS

The invention of the present application will now be described in more detail with reference to preferred embodiments, given only by way of example, and with reference to the accompanying drawings, in which:

FIG. 5 is a top elevational view of another nozzle according to the present invention, usable with gull wing leads, shown together with a phantom outline of a component engaged by the nozzle;

FIG. 6 is a side sectional view of the nozzle of FIG. 5, taken along line 6—6 of FIG. 5.

DETAILED DESCRIPTION OF THE INVENTION

Figure 1:
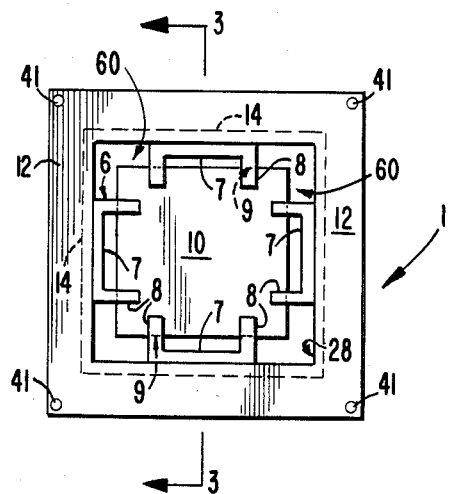
FIG. 1 is a top elevational view of a nozzle in registration with a component having J-type leads, according to the present invention.

FIG. 1 shows a top view of a nozzle 1 according to the present invention registered atop a component 10 and which is in engagement therewith. The component 10 overlies a printed circuit board which is omitted for the sake of clarity from FIG. 1, the printed circuit board being shown in FIG. 2. Also omitted from FIG. 1 for the sake of clarity are the terminal leads which are used for connecting the component 10 to the printed circuit board 26.

The nozzle 1 may be attachable to a source of hot air by a flange 12 having four bores 41 therein or it may be removably attached with respect to the hot air source so that different nozzles depending on the particular component to be installed or removed may be employed. The holes or bores 41 are adapted to receive screws, bolts, or the like for attachment to any source of hot air which can deliver hot air at a temperature suitable for the melting of solder and in particular suitable for the melting of the type of solder used in the attachment of electrical circuit components to printed circuit boards.

As seen in FIG. 1, the nozzle 1 has four walls 14, the walls 14 each having an interior surface 28. Four channel members 6 are fixed to the surface 28, as by welding or the like. Each of the channel-shaped members 6 has a pair of projecting flanges 8,8 and a flange connecting portion 7. The flanges 8,8 of each channel-shaped member 6 have at a lowermost extremity thereof (seen in dotted outline in FIG. 1) a recess or notch 9 adapted to receive uppermost side edges of the component 10.

Figure 2:
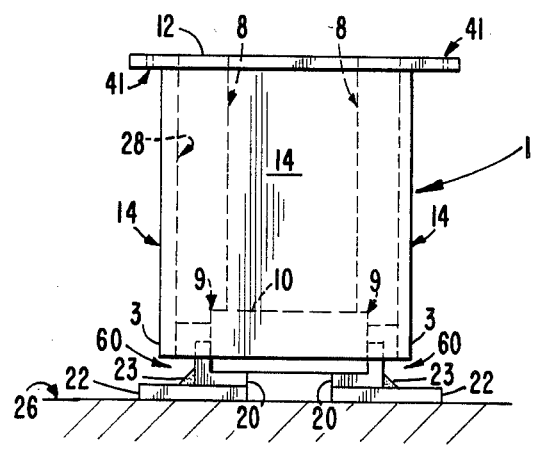
FIG. 2 is a side elevational view of the nozzle of FIG. 1 as seen from the right of FIG. 1.

As seen in FIG. 2, the component 10 is shown partially in dotted outline, may include a plurality of leads 20,20 where the component may be of the "leadless" type, the leads being incorporated in castellations (not shown) in the sides of the component and exaggerated in size for sake of clarity. The nozzle may also be employed with other lead configurations as discussed hereinafter. The leads 20,20 are respectively soldered to contact pads 22,22. The soldered connection is indicated schematically in FIG. 2 by portions 23,23. It is understood, of course, that soldered connections can take a great variety of shapes, and the solder itself may also be disposed between the leads 20 and respective pads 22. The contact pads 22, 22 are affixed to or are part of a substrate 26. In the preferred embodiment, the substrate 26 is a conventional printed circuit board and the pads 22,22 are of electrically conducting material.

Also as seen in FIG. 2, are a pair of notches 9,9 which can be seen in dotted outline. The notches 9,9 are formed in the flanges 8,8 (both shown in dotted outline in FIG. 2) and are in contact with the top surface and the side surfaces of the component 10.

A passageway 60 is formed between the nozzle 1, at its lowermost skirt portion 3, and the adjacent structures which include the component 10, leads 20, pads 22, and the printed circuit board 26. Due to the relatively snug and precise fit between the notches 9 formed in the flanges 8 with the uppermost side edges and top surface of the component 10, the skirt portion 3 of the nozzle 1 is maintained at a relatively precise, predetermined distance above the printed circuit board 26, (this distance characterizing a horizontal gap since the air flow is generally horizontal in direction when passing through this gap) and at a relatively uniform spacing away from the sidewalls of the component 10 (this distance characterizing a vertical gap since the air flow therethrough is generally vertically directed).

Due to the spacing of the sidewall skirt portion 3 from the sides of the component and to the spacing of the lower edge of the nozzle from the printed circuit board, melting of the solder at adjacent components is avoided. That is, much of the heat in the heated air is transferred to the solder to be melted. Then, when the heated air finally exits from under the lower edge of the skirt portion 3 of the nozzle, the heated air mixes with ambient air, thereby reducing the temperature of the flowing heated air.

The relatively small spacing between the sidewalls of the nozzle 1 and the sidewalls of the component 10, and the proximity of the lowermost edge of the skirt 3 to the substrate 26, causes a decrease in the area through which heated air can flow. Originally, the heated air can occupy substantially the entire available volume inside of the interior of the nozzle bounded by surface 28. However, at the peripheral gap 60 there is a significant decrease in the available area for fluid flow. Accordingly, there is a substantial increase in air velocity at the passageway 60 relative to that at the upper interior portions of the nozzle 1. This is a well-known phenomenon characteristic of all fluid flow. Due to the increased air velocity, the coefficient of heat transfer between the flowing fluid (air) and the elements over which the fluid flows, is increased substantially in the vicinity of the passageway 60 to cause rapid heating of the solenoid joint and of the solder 23. In addition, the component body creates a stagnation surface at which little or not fluid flow occurs. This reduces the rate of heat transfer from the fluid to the component body, which is desirable to minimize heat up of the component. Such increase in the coefficient of heat transfer due to an increase in fluid flow velocity and minimizing heat transfer at a stagnation surface are well-known in the fields of heat transfer, fluid flow, and thermodynamics, and need not be discussed further herein.

Figure 3:
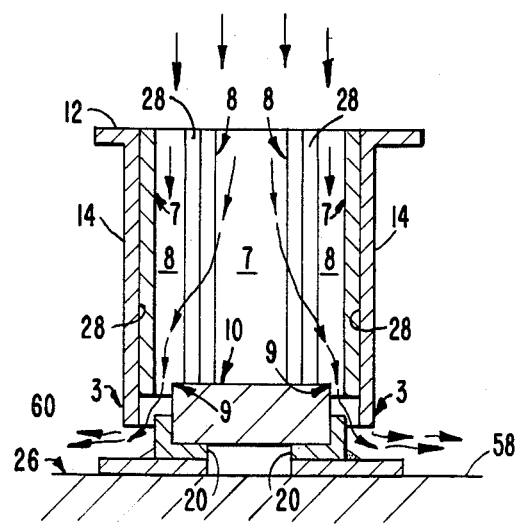
FIG. 3 is a sectional side view of the nozzle of FIG. 1 as taken along line 3—3 of FIG. 1.

FIG. 3 is a sectional view taken along line 3—3 of FIG. 1, and in addition to the parts shown and previously named in the foregoing with regard to FIG. 2, illustrates the air flow by the arrows shown therein. Further to the foregoing discussion, it is noted that the spacing of the lower edge from the board may preferably be such as to act as a control on the flow of the heated air as it passes the terminal leads and thereby ensures that sufficient heat is transferred to the solder to cause melting thereof. In general, the spacing between the nozzle wall and the sides of the component is preferably about 5-50 mils, as is the spacing of the lower edge of the nozzle from the printed circuit board. It will be understood that spacings outside these ranges may also be employed.

The ratio of the spacing of the skirt portion 3 in height above the printed circuit board to the spacing of the skirt portion 3 away from the sidewalls of the component, will depend on the particular type of component, where in some instances the spacing of the wall from the side walls of the component will be greater than the spacing between the lowermost edge of the skirt portion 3 of the nozzle and the printed circuit board while, in other instances, the converse will be true, again depending on the particular type of component used. In general, closeness of the sidewall to the component contributes to evenness of the air flow, while closeness of the lower edge of the nozzle skirt 3 to the circuit board 26 contributes to control of the velocity of the air and thereby to overall air flow control.

From the above discussion, it will be appreciated that the device of the present invention is intended to provide uniform mixing of heated air, together with even distribution of the heated air between the nozzle and the sides of the component in order to effect substantially simultaneous melting of the solder at the terminals of the component.

As can be appreciated from the foregoing, it is within the scope of the present invention to provide different nozzles for different components. Since components may vary in height, the vertical dimension of the notches 9 may vary to ensure a desired spacing between the lower edge of the nozzle skirt and the circuit board. In general, the greater the height of the component, the greater the vertical dimension of the notch.

The horizontal dimension of the notches is also preferably varied to accommodate different size components. In general, the dimension is so adjusted that the component snugly fits with the notches. This can be relatively ensured by utilizing the manufacturer's data for the component re the length (and width, in some instances), thereof. Hence, for example, if the length of component 10 of FIG. 3 in the horizontal direction is one inch ±0.005 inches, the distance between the vertical edges of the notches 9 would be 1.005 inches to accommodate the largest possible tolerance on the length of the component.

Due to the snug fit of the component with the notches, the notches may be utilized to effect alignment of the component with respect to the nozzle. As is known, the board (with component 10) may be positioned by known means with respect to the nozzle. By appropriately positioning the component with respect to the nozzle, the component will be engaged by notches 9 and thus aligned with the nozzle. Hence, in addition to the uniform heating of the component terminals described above, the notches 9 also facilitate component alignment with the nozzle in the manner described above.

Moreover, once the defective component has been removed subsequent to melting the terminals thereof, a replacement component may be inserted within the notches (and held in place by an appropriate, known vacuum device). The nozzle may then be returned to the exact position it was in when the defective component was removed by known means whereby the new component will be appropriately aligned with the pads or the like on the board so that the new component may be quickly attached to the board upon re-activation of the heated air source.

Figure 7:
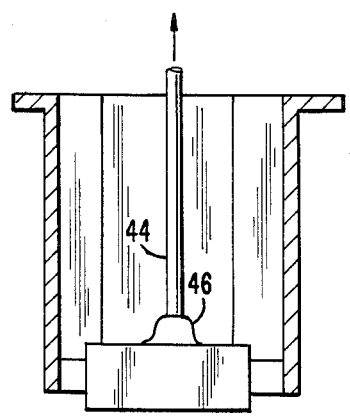
FIG. 7 is a side view, partially in section, of a component handling device usable with the nozzles according to the present invention.
Figure 4:
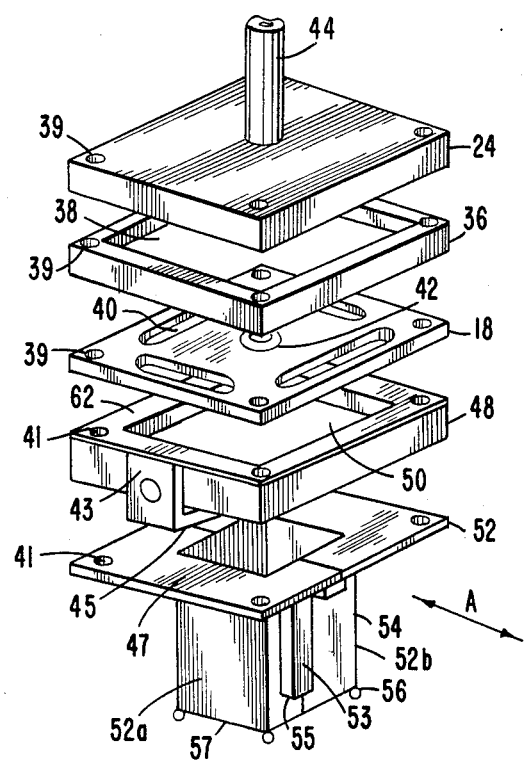
FIG. 4 is a perspective exploded view of a device usable with the nozzle according to the present invention.

FIG. 4 shows an exploded perspective view of a preferred construction of a device usable with the present invention, as shown in Application Ser. No. 790,448 filed Oct. 23, 1985, the disclosure of which is incorporated herein by reference. The heater device 24 may be any suitable device for heating air such as the heater device described and claimed in application Ser. No. 742,702 filed June 7, 1985. The heater device 24 is connected to a spacer member 36 having an opening 38 through which heated air passes towards baffle member 18. Baffle member 18 may comprise a plate, preferably by having elongated apertures 40 disposed about the edge of the baffle plate 18. A central aperture 42 is provided for receiving a vacuum conduit 44 for removing a component from the printed circuit board 26 following melting of the solder at the terminals 20, or for holding a component prior to installation on the printed circuit board 26. The vacuum conduit 44 is connected to a source of vacuum (not shown), and is provided with a suction cup 46 (as seen in FIG. 7) in order to ensure good attachment of the component 10 by the vacuum conduit 44.

The baffle member 18 is connected to a separator plate 48 having an opening 50 through which heated air passes following lateral deflection by the baffle member 18. The separator plate 48 is connected to nozzle 52 having a heated air delivery conduit 54 through which heated air passes towards the terminals 20 of the component 10. According to a preferred arrangement, the heated air delivery conduit 54 may be provided with spacer elements 56 in order to maintain the nozzle 52 at a desired distance above the upper surface 58 of the printed circuit board 26 so that heated air can exit through passageway 60 (as seen in FIG. 3) after contacting and heating the solder at the terminals 20. In order to ensure good delivery of heated air from the heater device 24 through the baffle member 18 and the nozzle 52, a sealing member 62 is provided on an upper surface of the apertured separator plate 48. This sealing member can be of any suitable high temperature sealing material.

Not only is the nozzle locator unit of FIG. 4, including separator plate 48 and nozzle 52, moveable with respect to the heating unit but also the nozzles usable therewith are typically removable from the nozzle locator unit. Thus, as states above, different nozzles may be employed to accommodate different components. As shown in FIG. 4, spring clips 43 may be disposed at opposite sides of separator plate 48, the clips having inwardly extending portions 45 for retaining the flange 47 of nozzle 52 in place whereby the nozzle is slidably inserted or removed in the direction of arrow A. The spring clips 43 may correspond to those shown at 378 in FIG. 17 of application Ser. No. 649,065 filed Sept. 10, 1984.

In general, further characteristics that the nozzle 1 and the channel members 6 should preferably include low thermal conductivity, high temperature capability, and structural stability. A material such as stainless steel is suitable since it has the above characteristics even when made relatively thin. In general, the nozzle wall thickness and the thickness of the channel members is preferably 5-30 mils. Thinner walls are preferred for minimum heat absorption capacity of the walls, with the wall thickness being limited by structural stability. Thinner walls for the channel members are also preferred to minimize heat transferred to the component from the channel members. Wall thicknesses other than those in the preferred range stated above may also be employed in suitable applications. If any portion of the wall 14 may contact the solder, that portion (at least) of the wall should not be solderable, should not be of any material which may be contaminating to the solder. Again, a material such as stainless steel fulfills this requirement.

A modified version of the nozzle 1 is shown in FIG. 5 as nozzle 2. Here, the nozzle 2 is used with gull wing terminal leads rather than with the "leadless" carrier embodiment of FIGS. 1-3. (Note the FIG. 1-3 embodiment may also be employed with other leads such as J-type leads and other similar type leads.) A circuit component 80 is seen in phantom outline in FIG. 5 engaged with notches 81 formed in flanges 88 of the nozzle 2. The nozzle 2 has an uppermost flange wall 82 having a plurality of bores 41' therein. The bores 41' are to receive bolts, screws and the like for fixing the nozzle to a source of heated air, such as that shown in FIG. 4 referred to hereinabove.

The nozzle 2 of FIG. 5 has an external surface 84 and an internal surface 98, the internal surface 98 being fixedly attached to a plurality of channel-shaped members 86. Each channel-shape member 86 has a pair of flange walls 88,88 and a connecting portion 87.

As seen in FIG. 6, the component 80 has gull wing leads 90,90 which are soldered to contact pads 92,92 which rest atop a substrate 96. The size of the leads and contact pads have been exaggerated in FIG. 6 for the sake of clarity. The substrate 96 is also preferably a printed circuit board. A passageway 61 is shown in FIG. 6 between a skirt portion 85 of the nozzle 2 and the adjacent elements which include gull wing leads 90, contact pads 92, and the substrate 96. As to the purpose and nature of use of the nozzle 2 having the passageway 61, such considerations are substantially identical to those discussed hereinabove with reference to passageway 60 of the embodiment of FIGS. 1-3. The function of the nozzle 2 is to precisely direct rapidly flowing heated air across the soldered joint 94,94 as seen in FIG. 6 to cause melting of the solder where the lower edge of wall 84 is typically disposed over the solder to be melted.

The nozzle 1 and the nozzle 2 according to the present invention can be used either for attachment or removal of the components 10 and 80, respectively, as follows. If the component 10 or 80 is to be attached to respective pads 22 or 92, then solder can be placed at the joint in unmelted form, and the respective nozzle placed over the positioned respective component. The hot air so directed would cause melting of the solder in an even manner, so that upon cooling of the soldered joint, the respective element 10 or 80 would be fixedly connected to the respective pads 22 or 92. Conversely, for removal of a component 10 or 80 which is already attached to respective ones of the pads 22 or 92, the nozzle can be precisely located atop the component 10 or 80 by the respective notches 9 or 81 against the uppermost top edges of the respective component 10 or 80, and hot air can then be directed over the soldered joint until the solder melts and the component can be removed.

While in a preferred embodiment, the nozzle has a generally rectangular cross-sectional outline, as does the respective component 10 or 80, other nozzle shapes could also be used, to conform closely to the solder pattern which is intended to exist between leads of the component and supporting pads to which the leads are attached. Thus, for other shapes of electrical components, the nozzle shape and nozzle skirt shape could be varied accordingly so as to maintain a relatively precisely predetermined gap for air flow adjacent the soldered joint itself. All such variations in shape are contemplated as being within the scope of the present invention.

Also, while pairs of flange walls have been shown as being attached to each of the generally planar interior walls of the nozzles shown, any number of such flanges can be used having notches (or other correspondingly-shaped recessed portions which are adapted to engage with a portion of a component) for which precise location relative to the nozzle, and to the printed circuit board, is desired. For example, each wall need only have a single flange member, or each wall can have varying numbers of flanges which need not be identical to one another, for example one wall may have if desired two flanges, while another wall need have only one, while still a third wall may have three such flange members. All such variations are contemplated as being within the scope of the present invention. Additionally, the flanges need not be generally planar or prismatic, but may have any shape, including a convoluted or curved shape, if desired. All such variations of shape of the flange members are contemplated as being within the scope of the present invention.

FIG. 7 schematically shows the use of a suction device for removing or placing a component (unnumbered in FIG. 7). The vacuum engagement means shown in FIG. 7 includes a suction cup 46 for resiliently engaging the component, and a vacuum conduit 44 which is connected to a source of vacuum (not shown).

While a suction means is shown for removing the component in FIG. 7, other means for moving or removing the component are contemplated as being within the scope of the present invention.

It has been found that components can be quickly and cleanly desoldered and removed from a printed circuit board utilizing the device of the present invention. The nozzle configuration and registration means of the present invention gives rise to relatively uniform distribution of heated air about the terminals of a component, and permits precise positioning of the nozzle relative to the electrical component's soldered joints. The spacing between the sides of the component and the inner surfaces of the nozzle permits substantially simultaneous melting of the solder at all of the terminals without significant overheating of the component itself, the substrate, or adjacent components.

The foregoing described embodiments have been included herein for illustrative purposes only, and are in no way intended to limit the scope of the present invention. Modifications to the embodiments shown, and further embodiments within the scope hereof, will be apparent to those skilled in the art to which the present invention pertains.

What is claimed is:

1. A device for melting solder at a joint between terminals of an electronic component and contact elements of a substrate, comprising:
   a nozzle in the form of a tubular body having a plurality of sidewalls;
   means for supplying heated fluid to said nozzle to melt said solder;
   a plurality of elongated flanges where at least one of the flanges is attached to and projects outwardly from the inner side of each sidewall of the tubular body of the nozzle and extends between a first end of the tubular body and a skirt portion formed by an opposite end of the tubular body; and
   engagement means, formed on said flanges, for engaging said component and precisely locating it in spaced relationship relative to said skirt portion of the tubular body.

2. A device according to claim 1, wherein said engagement means includes notches on said flanges for contacting predetermined portions of the component.

3. A device according to claim 2, wherein each said notch is located at a lower, inner portion of each of the flanges, and each said notch being shaped to snugly receive an uppermost edge of the component.

4. A device according to claim 3, wherein at least some of the sidewalls of the tubular body of the nozzle have a plurality of said flanges.

5. A device according to claim 2, wherein at least some of the sidewalls of the tubular body of the nozzle have a plurality of said flanges.

6. A device according to claim 1, wherein said tubular body and the flanges are formed of low thermal conductivity, high temperature capability material.

7. A device according to claim 6, wherein the thickness of the material forming the walls of the tubular body and flanges are 5–30 mils.

8. A device according to claim 7, wherein the tubular body and flanges are formed of a stainless steel.

9. A device according to claim 1, wherein said flanges with said engagement means forms a means for controlling air flow to the solder to be melted by setting or said spaced relationship to produce evenness of the air flow and control of its velocity.

10. A device as in claims 1 or 2 where the interior space of said tubular body is open to the extent that said heated fluid can contact the upper surface of said electronic component.

11. A device as in claim 10 where said engagement means also precisely locates said opposite end of the tubular body in spaced relationship relative to said substrate.

12. A device as in claim 10 where said elongated flanges include at each sidewall at least one channel member.

13. A device as in claim 10 where said engagement means includes notches on said flanges for contacting predetermined portions of the component.

14. A device as in claim 10 where said tubular body is of rectangular parallelepiped configuration.

15. A nozzle for use with a device for melting solder at a joint between terminals of an electronic component and contact elements of a substrate by supplying heated fluid to the nozzle to melt the solder, comprising:
   a tubular body having a plurality of sidewalls;
   a plurality of elongated flanges where at least one of the flanges is attached to and projects outwardly from the inner side of each sidewall of the tubular body and extends between a first end of the tubular body and a skirt portion formed by an opposite end of the tubular body; and
   engagement means, formed on said flanges, for engagement said component and precisely locating it in spaced relationship relative to said skirt portion of the tubular body.

16. A nozzle according to claim 15, wherein said engagement means includes notches on said flanges for contacting predetermined portions of the component.

17. A nozzle according to claim 16, wherein each said notch is located at a lower, inner portion of each of the flanges, and each said notch being shaped to snugly receive an uppermost end of the component.

18. A nozzle according to claim 17, wherein at least some of the sidewalls of the tubular body of the nozzle have a plurality of said flanges.

19. A nozzle according to claim 16, wherein at least some of the sidewalls of the tubular body of the nozzle have a plurality of flanges.

20. A nozzle as in claim 15 or 16 where the interior space of said tubular body is open to the extent that said heated fluid can contact the upper surface of said electronic component.

21. A nozzle as in claim 20 where said engagement means also precisely locates said opposite end of the tubular body in spaced relationship relative to said substrate.

22. A nozzle as in claim 20 where said elongated flanges include at each sidewall at least one channel member.

23. A nozzle as in claim 20 where said engagement means includes notches on said flanges for contacting predetermined portions of said component.

* * * * *